(12) United States Patent
Kendall

(10) Patent No.: US 10,990,651 B2
(45) Date of Patent: *Apr. 27, 2021

(54) SYSTEMS AND METHODS FOR EFFICIENT MATRIX MULTIPLICATION

(71) Applicant: Rain Neuromorphics Inc., Redwood City, CA (US)

(72) Inventor: Jack David Kendall, Millbrae, CA (US)

(73) Assignee: Rain Neuromorphics Inc., San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/543,426

(22) Filed: Aug. 16, 2019

(65) Prior Publication Data

US 2020/0042572 A1 Feb. 6, 2020

Related U.S. Application Data

(63) Continuation of application No. 16/376,169, filed on Apr. 5, 2019, now Pat. No. 10,430,493.

(Continued)

(51) Int. Cl.
*G06F 16/17* (2019.01)
*G06N 3/063* (2006.01)
(Continued)

(52) U.S. Cl.
CPC ........... *G06F 17/16* (2013.01); *G06N 3/0635* (2013.01); *G11C 13/0004* (2013.01);
(Continued)

(58) Field of Classification Search
CPC .... G06F 17/16; G06N 3/0635; G11C 13/0004
See application file for complete search history.

(56) References Cited

U.S. PATENT DOCUMENTS 5,613,042 A 3/1997 Chung
8,433,665 B2 4/2013 Tang
(Continued)

FOREIGN PATENT DOCUMENTS

| JP | 09185596 | 7/1997 |
|---|---|---|
| WO | 2015195365 | 12/2015 |
| WO | 2018217632 | 11/2018 |

OTHER PUBLICATIONS

Hu et al. (Jun. 2016). Dot-product engine for neuromorphic computing: Programming 1T1M crossbar to accelerate matrix-vector multiplication. In Proceedings of the 53rd annual design automation conference (p. 19). ACM.

(Continued)

*Primary Examiner* — Chuong D Ngo
(74) *Attorney, Agent, or Firm* — Van Pelt, Yi & James LLP

(57) ABSTRACT

Disclosed are systems and methods for performing efficient vector-matrix multiplication using a sparsely-connected conductance matrix and analog mixed signal (AMS) techniques. Metal electrodes are sparsely connected using coaxial nanowires. Each electrode can be used as an input/output node or neuron in a neural network layer. Neural network synapses are created by random connections provided by coaxial nanowires. A subset of the metal electrodes can be used to receive a vector of input voltages and the complementary subset of the metal electrodes can be used to read output currents. The output currents are the result of vector-matrix multiplication of the vector of input voltages with the sparsely-connected matrix of conductances.

19 Claims, 4 Drawing Sheets

Related U.S. Application Data

(60) Provisional application No. 62/653,194, filed on Apr. 5, 2018.

(51) Int. Cl.
*G06F 17/16* (2006.01)
*G11C 13/00* (2006.01)

(52) U.S. Cl.
CPC ........ *G11C 13/004* (2013.01); *G11C 13/0026* (2013.01); *G11C 13/0028* (2013.01); *G11C 13/0069* (2013.01); *G11C 2213/19* (2013.01)

(56) References Cited

U.S. PATENT DOCUMENTS

| | | | |
|---|---|---|---|
| 10,430,493 B1 * | 10/2019 | Kendall | G11C 13/0028 |
| 2004/0153426 A1 | 8/2004 | Nugent | |
| 2010/0081958 A1 | 4/2010 | She | |
| 2011/0001117 A1 | 1/2011 | Lieber | |
| 2011/0096589 A1 | 4/2011 | Bratkovski | |
| 2012/0036919 A1 | 2/2012 | Kamins | |
| 2014/0151623 A1 | 6/2014 | Jeon | |
| 2017/0098156 A1 | 4/2017 | Nino | |
| 2017/0141302 A1 | 5/2017 | Bessonov | |
| 2017/0228345 A1 | 8/2017 | Gupta | |
| 2018/0046919 A1 | 2/2018 | Li | |
| 2019/0051825 A1 | 2/2019 | Vasquez | |

OTHER PUBLICATIONS

Bellew et al., Programmability of Nanowire Networks, Nanoscale, Royal Society of Chemistry, Apr. 30, 2014, pp. 9632-9639.

Prakash et al., Resistive Switching Memory Characteristics of Ge/Geox Nanowires and Evidence of Oxygen Ion Migration, Nanoscale Research Letters, Nano Express, 2013, pp. 1-10.

Suri et al., Bio-Inspired Stochastic Computing Using Binary CBRAM Synapses, IEEE Transactions on Electron Devices, vol. 60, No. 7, Jul. 2013, pp. 2402-2409.

Wei Lu, Image Processing 1,000 Times Faster is Goal of New $5M Contract, Michigan Engineering, Aug. 14, 2013.

* cited by examiner

SYSTEMS AND METHODS FOR EFFICIENT MATRIX MULTIPLICATION

CROSS-REFERENCE TO RELATED APPLICATIONS

This application is a continuation of co-pending U.S. patent application Ser. No. 16/376,169 entitled SYSTEMS AND METHODS FOR EFFICIENT MATRIX MULTIPLICATION filed Apr. 5, 2019, which claims priority to U.S. Provisional Patent Application No. 62/653,194 entitled ANALOG PROCESSOR FOR SPARSE VECTOR-MATRIX MULTIPLICATION filed Apr. 5, 2018, both of which are incorporated herein by reference for all purposes.

BACKGROUND

This invention relates generally to computer hardware, and in particular to accelerators designed for performing efficient matrix operations in fields such as artificial intelligence and memory devices.

DESCRIPTION OF THE RELATED ART

Matrix operations are used in a variety of modern computing tasks. Many physical phenomena can be represented by one or more matrices of numerical values and processed in modern computers. For example, still photographs, video image frames, sensor output data, an interval of speech, financial transaction data, autonomous driving sensor data, and many other physical objects or parameters can be represented by one or more matrices of numerical values suitable for processing, manipulation and operation in modern computers. While general-purpose computing hardware can be used to perform matrix operations, the characteristics of matrix data and matrix operations can make them good candidates for designing hardware customized to more efficiently process matrix workloads and matrix operations compared to general-purpose computers. One form of matrix operation frequently used in modern computing tasks is digital vector-matrix multiplication.

In conventional digital vector-matrix multiplication, a vector of input values is provided along with a matrix of parameter values. The multiplication of the two results in a single vector output. If the size of the input and output vectors are both n, the computational complexity of this operation scales as $O(n^2)$.

An alternative style of vector-matrix multiplication with crossbar arrays and associated hardware uses the concept of in-memory computing and is limited only by the speed at which data can be loaded into the array. This results in $O(n)$ scaling in computation time. These architectures are commonly known as dot-product engines (DPEs). However, in order to maintain this $O(n)$ scaling, DPEs require $O(n^2)$ spatial resources on-chip for storing the parameter values in dense crossbar matrices. Thus, deploying existing DPEs, in some cases, require an undesirable trade-off between computation time efficiency and on-chip area.

Consequently, there is a need for devices and methods of operating them that allow vector-matrix multiplication, which also scale as $O(n)$ in computation time and spatial resources, as opposed to scaling quadratically in chip area, as the case maybe in traditional DPEs.

SUMMARY

In one aspect of the invention, a system of sparse vector-matrix multiplication is disclosed. The system includes: a silicon substrate; a circuit layer formed in or on the substrate; a plurality of electrodes formed on the circuit layer; and a mesh formed randomly on the plurality of electrodes, wherein the circuit layer is configured to: receive a plurality of digital input signals; convert the plurality of digital input signals to a plurality of analog input signals; write the plurality of analog input signals on an input set of the plurality of electrodes; read from an output set of the plurality of electrodes a plurality of analog output signals, convert the plurality of analog output signals to a plurality of digital output signals, and output the plurality of digital output signals.

In some embodiments, the mesh includes coaxial nanowires having a metal core wrapped in two-terminal non-volatile memory (NVM) material.

In one embodiment, the non-volatile memory material includes a voltage-controlled resistance.

In another embodiment, the circuit layer includes: an input register configured to receive the plurality of the digital input signals; one or more digital to analog converters configured to convert the plurality of digital input signals to a plurality of analog input signals; one or more analog to digital converters configured to convert the plurality of analog output signals to the plurality of digital output signals; and an output register configured to receive and store the plurality of digital output signals.

In one embodiment, the circuit layer further includes a column driver and a row driver configured to selectively provide biasing voltages and/or training voltages to the plurality of the electrodes.

In another embodiment, the plurality of analog input signals include voltages and the plurality of analog output signals include currents, or vice versa.

In some embodiments, the plurality of analog input signals include voltages, the plurality of analog output signals include currents, and the circuit layer further includes: a plurality of amplifiers coupled to the plurality of electrodes, wherein amplifiers coupled to the input set of the plurality of electrodes are configured as a sample-and-hold (SAH) amplifier and configured to write the plurality of analog input signals to the input set, and amplifiers coupled to the output set of the plurality of the electrodes are configured as current-sensing amplifiers and configured to read the plurality of analog output signals.

In one embodiment, the plurality of electrodes include neurons in a neural network layer.

In another embodiment, the plurality of electrodes and the randomly formed mesh include a matrix of conductances.

In some embodiments, the matrix of conductances is tunable using one or more of temperature-driven phase-change memory mechanisms, unipolar resistive switching, and bipolar memristive mechanisms.

In another aspect of the invention, a method of sparse vector-matrix multiplication is disclosed. The method includes: providing a plurality of electrodes on a silicon substrate; forming a layer of randomly arranged coaxial nanowires on the plurality of electrodes; receiving a plurality of digital input signals; converting the plurality of digital input signals to a plurality of analog input signals; writing the plurality of analog input signals on an input set of the plurality of electrodes; reading from an output set of the plurality of electrodes a plurality of analog output signals; converting the plurality of analog output signals to a plurality of digital output signals; and outputting the plurality of digital output signals.

In one embodiment, the coaxial nanowires include a metal core wrapped in two-terminal non-volatile memory (NVM) material.

In another embodiment, the NVM material includes one or more of a voltage-controlled resistance, memristor, phase-change material (PCM), and resistive random-access-memory (ReRAM) material.

In some embodiments, the method further includes: selectively providing biasing voltages to the plurality of the electrodes to enable writing voltages into or reading currents from the plurality of the electrodes.

In one embodiment, voltage-controlled resistances are formed at intersections of the plurality of the electrodes and the randomly arranged coaxial nanowires and the method further comprises selectively providing training voltages to the plurality of the electrodes to adjust the voltage-controlled resistances.

In some embodiments, the method further includes receiving a training signal indicating which electrodes in the plurality of the electrodes are to be applied the training voltages.

In one embodiment, the plurality of the electrodes include neurons in a neural network layer.

In another embodiment, the plurality of the electrodes and the layer of randomly arranged coaxial nanowires form a matrix of conductances and the conductances are tuned by performing gradient descent.

In some embodiments, the plurality of analog input signals include voltages and the plurality of analog output signals include currents.

In one embodiment, the input and output sets each comprise half of the electrodes of the plurality of electrodes.

BRIEF DESCRIPTION OF THE DRAWINGS

These drawings and the associated description herein are provided to illustrate specific embodiments of the invention and are not intended to be limiting.

DETAILED DESCRIPTION

Figure 1:
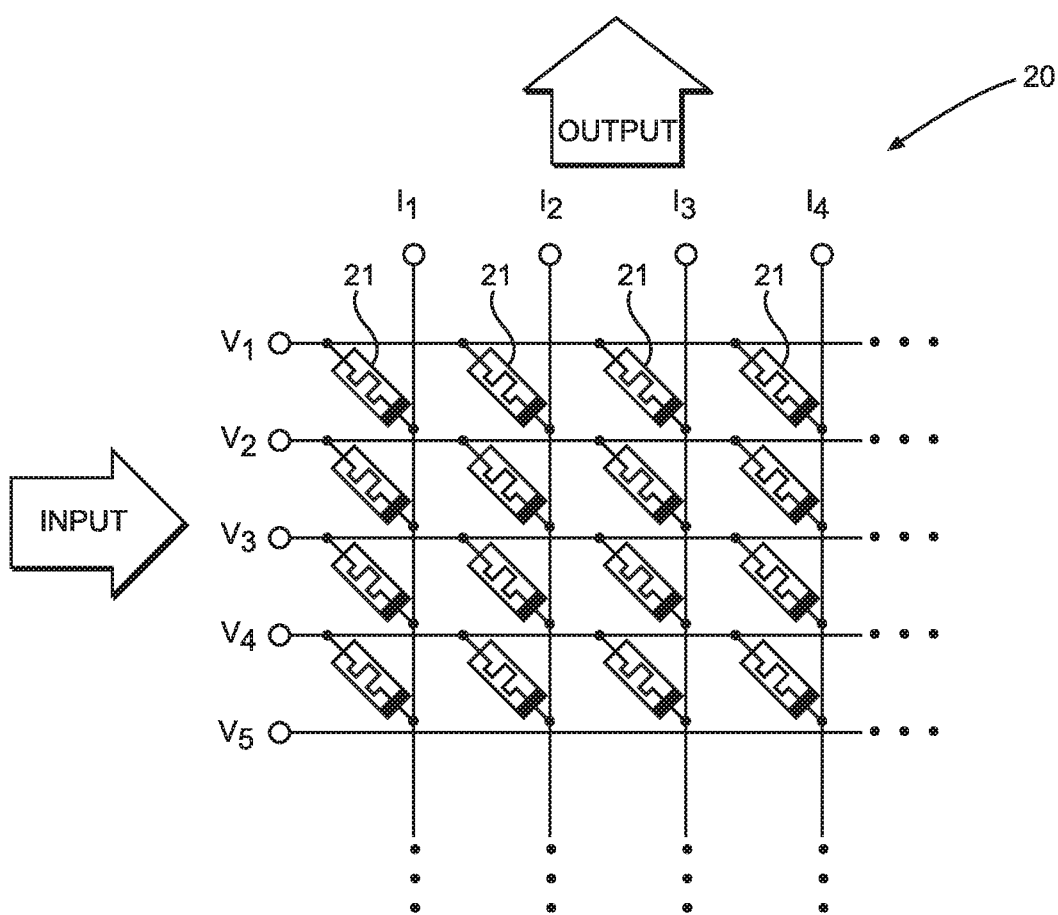
FIG. 1 illustrates a diagram of a matrix in a dot-product engine used to perform vector-matrix multiplication.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Unless defined otherwise, all terms used herein have the same meaning as are commonly understood by one of skill in the art to which this invention belongs. All patents, patent applications and publications referred to throughout the disclosure herein are incorporated by reference in their entirety. In the event that there is a plurality of definitions for a term herein, those in this section prevail.

Definitions

The term "about" as used herein refers to the ranges of specific measurements or magnitudes disclosed. For example, the phrase "about 10" means that the number stated may vary as much as 1%, 3%, 5%, 7%, 10%, 15% or 20%. Therefore, at the variation range of 20% the phrase "about 10" means a range from 8 to 12.

When the terms "one", "a" or "an" are used in the disclosure, they mean "at least one" or "one or more", unless otherwise indicated.

The term "processor" can refer to various microprocessors, controllers, and/or hardware and software optimized for loading and executing software programming instructions or processors including graphics processing units (GPUs) optimized for handling high volume matrix data related to image processing.

The term "conductance" refers to the degree by which a component conducts electricity. Conductance can be calculated as the ratio of the current that flows through the component to the potential difference present across the component. Conductance is the reciprocal of the resistance and is measured in siemens.

The term "dense" in the context of matrix multiplication engines described herein can refer to engines where there is an electrical connection or path from each input to each output node of the matrix multiplication engine.

The term "sparse" in the context of matrix multiplication engines described herein can refer to an engine where not all possible or available connections are made between input and output nodes of the matrix multiplication engine.

Dense Matrix Multiplication Engine

One example of hardware specialized for performing vector-matrix multiplication is a dot-product-engine based on a crossbar architecture.

FIG. 1 illustrates a diagram of a matrix 20 in a dot-product engine used to perform vector-matrix multiplication. Matrix 20 utilizes a crossbar array architecture and includes horizontal input voltage lines intersecting vertical output current lines. As an example, the input/output voltage/current lines can be neurons in a neural network layer, when matrix 20 is used to perform vector-matrix multiplication in the context of neural networks. The input voltage lines and output current lines are made of conductive metal material. At intersections of input voltage lines and output current lines, a material made of non-volatile memory (NVM) 21 connects the input voltage lines to the intersecting output current lines. In some implementations, this is achieved via lithographically patterning electrode lines (horizontal and vertical lines) to sandwich an NVM-type material 21. The vector of input voltages is applied on the input voltage lines. The output current at each column is determined by the sum of currents from each intersection of that column with input voltage lines and determined by applying Kirchhoff's current law (KCL) for each intersection. The matrix 20 is partially formed by NVM material 21 whose resistances are controllable by applying an appropriate voltage. Therefore, a matrix of parameter values (e.g., matrix of weights in a layer of a neural network) can be constructed in the matrix 20 by adjusting the intersection resistances to match the matrix of parameter values of a desired computation.

Performance of Dense Matrix Multiplication Engine

The dot-product engine utilizing matrix 20 can be characterized as a dense array structure, where each input and output are connected. Notably, the chip area required to implement the matrix 20 scales quadratically relative to the number of input and output neurons it provides. In other words, input/output neurons and chip area needed to implement the matrix 20 scale at different rates. While input/output neurons scale linearly (on the edges of matrix 20), the chip area needed to implement vector-matrix multiplication of those additional neurons grows quadratically (in the area of the matrix 20).

Coaxial Nanowires

Recent discoveries of new materials have the potential to revolutionize computing hardware and approaches to designing hardware tasked with executing software. As computing hardware designed only based on traditional silicon material approach its physical limit of performance, designs based on new material alone or in combination with silicon-based circuits promise greater efficiency in hardware. The discovery and ability to build nanoscale material, such as nanowires and materials with desirable mechanical, or electrical properties promise advancements and improvements in computing methods and devices, including hardware customized and optimized for performing matrix multiplication.

Figure 2:
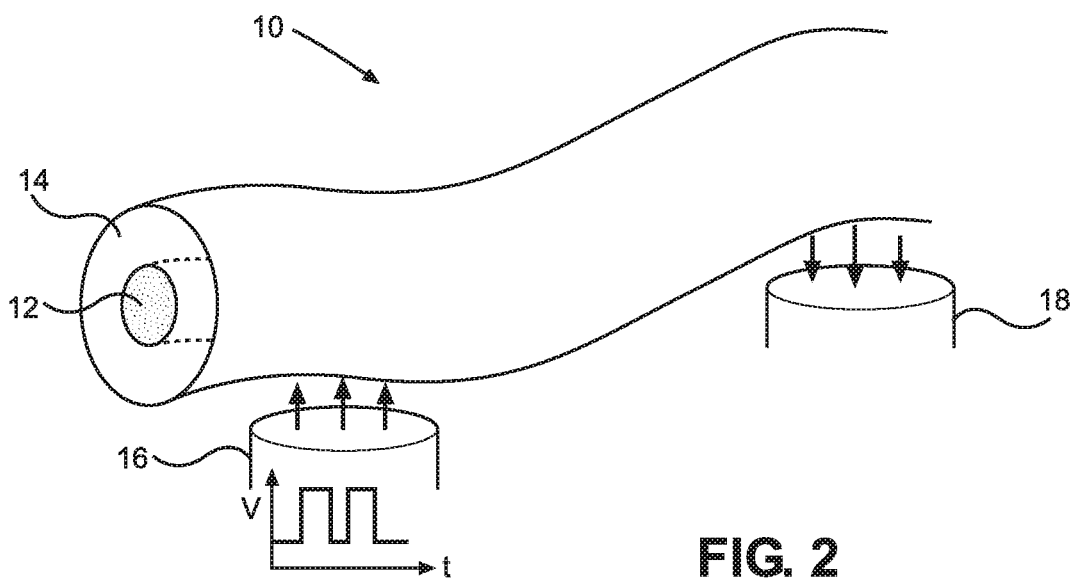
FIG. 2 illustrates a diagram of a coaxial nanowire, which can be utilized in building high efficiency computing hardware.

FIG. 2 illustrates a diagram of a coaxial nanowire 10, which as will be described can be utilized in building high efficiency computing hardware. The coaxial nanowire 10 includes a metal core 12 wrapped in a two-terminal non-volatile memory (NVM) material 14. The coaxial nanowire 10 touches two metal electrodes 16 and 18.

The NVM material is a two-terminal device, whose resistance is controlled by voltages applied above or below some threshold voltages across the two terminals. For example, when the electrode 16 applies a voltage above a positive threshold voltage (SET-voltage) to the NVM material 14, the NVM material 14 may undergo dielectric breakdown and one or more conductive filaments are formed through it, thereby lowering its electrical resistance and increasing its conductivity. Subsequently, the electrical connection between the electrodes 16 and 18 can be strengthened via the now more-conductive NVM material 14 and the metal core 12. When the electrode 16 applies a voltage below a negative voltage threshold (RESET-voltage) to the NVM material 14, the dielectric breakdown process is reversed, the filaments dissolve away and the electrical resistance of the NVM material 14 reverts to its original value or some other lower resistance, thereby weakening the electrical connection between the electrodes 16 and 18. For voltages above the SET-voltage, the NVM material 14 is transformed to low resistance state (LRS) and for voltages below the RESET-voltage, the NVM material 14 is transformed to high resistance state (HRS). In other words, coaxial nanowire 10 forms a memory device at the intersection of its contact with an electrode. The resistance at the interface is dependent upon previously applied voltage (if the previous voltage was above the SET-voltage or below the RESET voltage).

Examples of NVM material 14 includes, memristors, phase-change material (PCM), resistive random-access-memory (ReRAM) material, or any other material whose resistance is voltage-controlled, including any material which retains a resistance in response to an applied voltage with respect to one or more threshold voltages.

Sparse Vector-Matrix Multiplication Engine

An application of the coaxial nanowire 10 can be explored in the context of hardware designed to perform matrix multiplication. Matrix multiplication is used in many modern computing tasks, such as artificial intelligence (AI), machine learning, neural network, neural network training, various transforms (e.g., Discrete Fourier Transform), and others. The non-volatile and controllable memory properties of the shell of coaxial nanowire 10 can be exploited to make hardware that can efficiently perform matrix multiplication. A form of matrix multiplication used in modern computing tasks is digital vector-matrix multiplication, where a vector of input values is multiplied by a matrix of parameter values. The multiplication yields an output vector. The coaxial nanowire 10 can be used to construct the matrix of parameter values. Parameter values can be any parameter values used in various computing tasks, for example weights in a layer of neural network. A vector of input values can be multiplied by a matrix of weights producing an output vector of the layer.

To design computing hardware that can perform vector-matrix multiplication, one can represent the digital input values with a vector of analog input voltages and a matrix of conductances can represent the matrix of parameter values. The Ohm's law equation ($I=VG$, where I is current, V is voltage and G is conductance) can be used to obtain an analog output vector of currents representing the output of multiplication of the input values by the matrix of parameter values. The analog output vector can be converted to digital output values and outputted.

Compared to the dot-product engine of FIG. 1, an alternative engine for performing vector-matrix multiplication can use electrodes, distributed over a chip area, sparsely connected with coaxial nanowires 10, where electrodes can distribute input and output nodes over the chip area where they exist as opposed to only the lateral edges of a crossbar array as is the case in the dot-product engine of FIG. 1. A network of distributed electrodes sparsely-connected with coaxial nanowires 10 can construct a conductance matrix, which can be used as a parameter matrix in desired computations. A subset of the electrodes can be used to feed a vector of input voltages and the complementary subset of the electrodes can be probed to read a vector of output currents. The output vector of currents is the result of vector-matrix multiplication of the vector of input voltages with the matrix of conductances according to Ohm's law.

Figure 3:
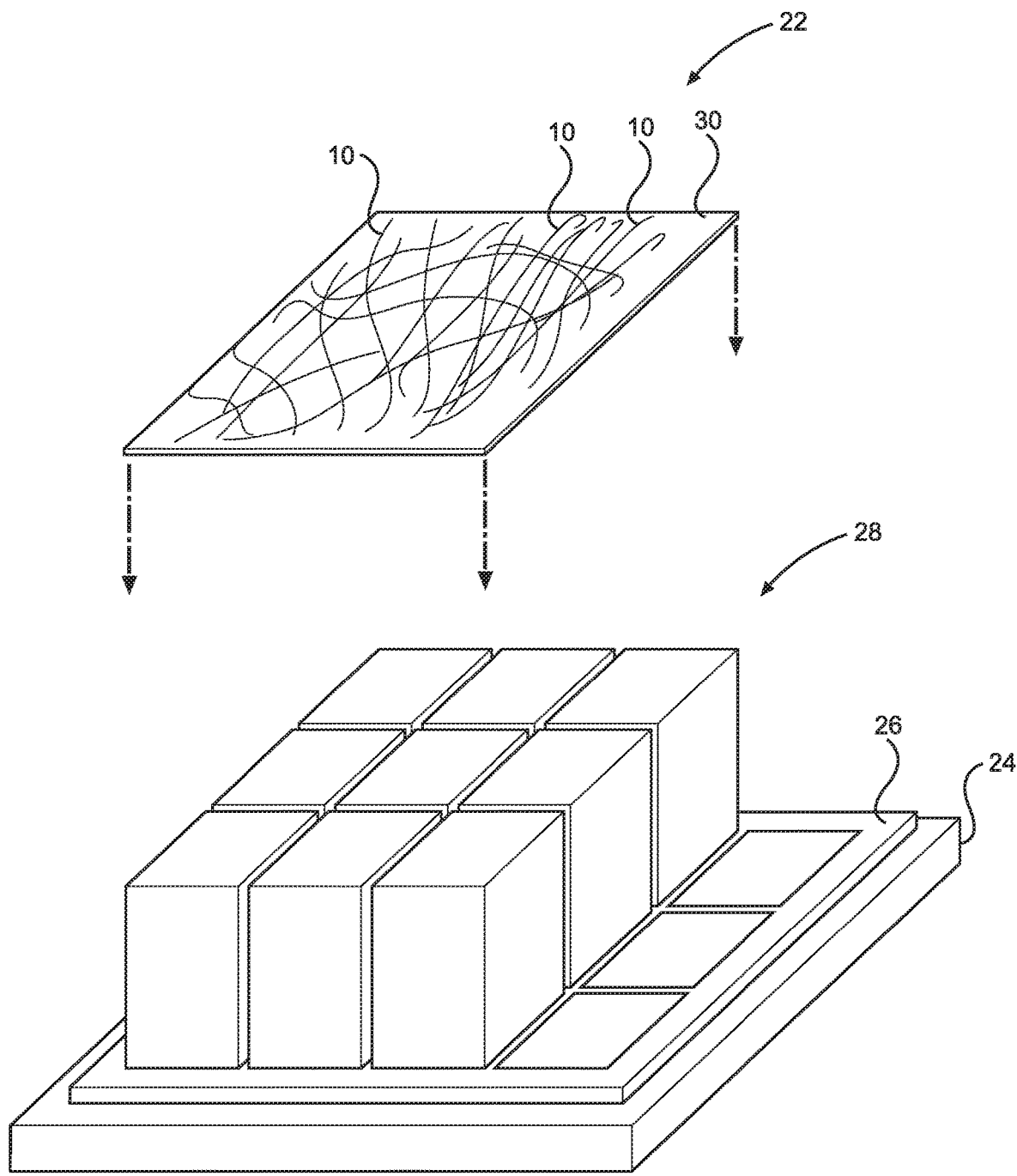
FIG. 3 illustrates a diagram of a sparse vector-matrix multiplication (SVMM) engine according to an embodiment.

FIG. 3 illustrates a diagram of a sparse vector-matrix multiplication (SVMM) engine 22. The SVMM engine 22 includes a silicon substrate 24, control circuitry within a circuit layer 26, for example, a complementary metal-oxide-semiconductor (CMOS) layer, a grid of electrodes 28 and a randomly formed mesh 30 of coaxial nanowires 10 deposited on top of the grid 28. Mesh 30 is placed above or formed on top of the electrode grid 28, providing physical contact between the mesh 30 and the top of electrode grid 28. Alternatively, the electrodes of the grid 28 can be grown through the mesh 30 as pillars of metal. The coaxial nanowires 10 deposited randomly on top of the electrodes of the grid 28 can provide electrical connections between the electrodes that they contact. Consequently, the coaxial nanowires 10 sparsely connect the electrodes of the grid 28. The strength of the electrical connections between the electrodes can be modulated based on increasing or decreasing the resistances of the coaxial nanowires 10.

In a training mode of the SVMM engine 22, the circuitry in the circuit layer 26 can be used to apply a SET-voltage or a RESET-voltage to some or all of the coaxial nanowires 10 in the mesh 30 via electrodes in the grid 28. The electrical resistances of the coaxial nanowires 10 in mesh 30 can increase or decrease depending on the voltages they receive via the electrodes in the grid 28, thereby strengthening or weakening the electrical connections between the electrodes of the grid 28. Because the coaxial nanowires 10 in mesh 30 are randomly formed, they can create random electrical connections between the electrodes in the grid 28 via the NVM-type material and the metal cores of the nanowires 10. Thus, the electrodes of the grid 28 are sparsely connected via the coaxial nanowires 10 of mesh 30.

The grid 28, sparsely connected with the mesh 30 forms a sparsely connected matrix of conductances, which can be used for vector-matrix multiplication. A vector of input voltages can be applied to a subset of the electrodes in the grid 28 (the input electrodes) and the remainder of the electrodes (the output electrodes) can be used to read an output vector of currents. In this arrangement, the output vector of currents can represent the output of a vector-matrix multiplication of the vector of input voltages with sparsely connected matrix of conductances formed by the grid 28 according to Ohm's law.

In various applications, the resistances formed at the intersection of the electrodes of the grid 28 and the mesh 30 can be adjusted by tuning or fitting to known sets of input/output pairs until a useful matrix of conductances is formed. In other words, although the matrix of conductances formed by the SVMM engine 22 is made of unknown or random resistances, formed by random connections between electrodes of the grid 28 via coaxial nanowires 10 of mesh 30, the conductances can be adjusted by applying a combination of SET-voltages and/or RESET-voltages to the electrodes of the grid 28 and observing the outputs. Various fitting techniques and algorithms may be used to determine the direction by which the electrode-mesh interface resistances should be adjusted.

The interface resistances, corresponding to the matrix of conductances formed by grid 28 and mesh 30, can be adjusted through a variety of means, including using voltage pulses at the electrodes of the grid 28 to switch or nudge the resistances according to temperature-driven phase-change memory mechanisms, unipolar resistive switching, or bipolar memristive mechanisms. These techniques can be used to tune the values of the conductance matrix to a task, for instance as a content-addressable memory (CAM), a neural network layer, or as a more general memory interconnect. Examples of algorithms, which can be used in connection with the SVMM engine 22, can be found in International Patent Application No. PCT/US2018/033669, filed on May 21, 2018 and titled, "DEEP LEARNING IN BIPARTITE MEMRISTIVE NETWORKS." In one embodiment, gradient descent learning can be used to tune the conductance matrix of the SVMM engine 22.

The shape, number and geometry of the grid 28 can be modified based on implementation. In some embodiments, the electrodes need not be in a grid format. Various design and implementation considerations may dictate an alternative geometry of the SVMM engine 22 without departing from the spirit of the described technology.

Figure 4:
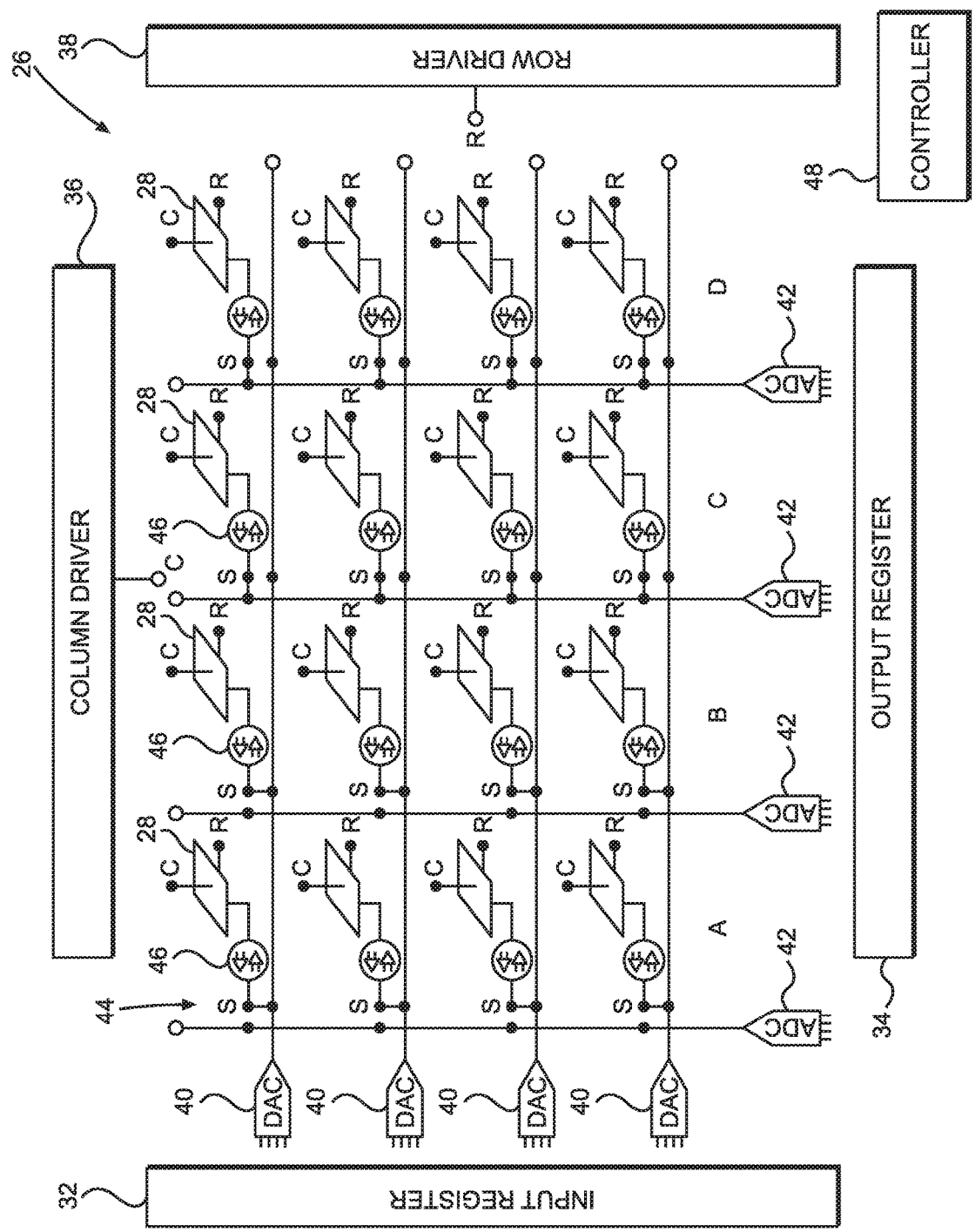
FIG. 4 illustrates a diagram of an embodiment of the circuit layer and the electrodes of the embodiment of FIG. 3.

FIG. 4 illustrates a diagram of an embodiment of the circuit layer 26 and the electrodes of the grid 28. Circuit layer 26 can be implemented as a CMOS layer and can include components such as an input register 32, an output register 34, a column driver 36, a row driver 38, one or more digital to analog converters (DACs) 40, one or more analog to digital converters (ADCs) 42, amplifiers 46, switches 44 and other components and circuitry as may be used to implement the functionality of the SVMM engine 22 in the circuit layer 26. Electrodes of the grid 28 are shown for illustration purposes, but in some embodiments, the electrodes of the grid 28 are metal pillars grown above the circuit layer 26 and may not be a part of the circuit layer 26. Mesh 30, while not shown in FIG. 4, is built above the electrodes of the grid 28 and provides random electrical connections between those electrodes as described in relation to FIG. 3.

Electrodes of the grid 28 can be connected to the column driver 36 and row driver 38. The column and row drivers 36 and 38 include circuitry (e.g., logic gates, high and low power supply rails, etc.) to provide various voltages to the electrodes of the grid 28. In one embodiment, the row and column drivers 36 and 38 can provide one or more bias voltages in the range above the RESET-voltage and below the SET-voltage to enable writing voltages and/or reading currents to or from one or more electrodes of the grid 28. Column and row drivers 36 and 38 can receive a training signal with respect to one or more electrodes of the grid 28. If the training signal is ON, the column and/or row drivers 36 and 38 can provide a training voltage pulse above the SET-voltage or below the RESET-voltage to adjust the resistances at the electrode-mesh interfaces. If the training signal for one or more electrodes within the grid 28 is OFF, the column and/or row drivers 36 and 38 would not apply voltages above the SET-voltage or voltages below the RESET-voltage.

In some embodiments, the SVMM engine 22 operates at a virtual ground (mid-supply) and when the training signal is ON, a train of pulse voltages are sent to a transistor gate that connects one or more electrodes of the grid 28 to high power supply rail (Vdd) or to the low power supply rail (ground). The column or row drivers 36 and 38 can receive one or more control signals indicating in which direction (e.g., high or low) the resistances at interfaces of the electrodes of the grid 28 and mesh 30 should be moved.

The circuit layer 26 can be designed to enable addressing each electrode of the grid 28 individually or it can be designed to address multiple electrodes of the grid 28 in parallel for efficiency purposes and to save on-chip area consumed by the circuit layer 26 and components therein.

The SVMM engine 22 can receive digital input signals (e.g., at predetermined intervals, intermittently or at random) from a variety of sources and depending on the application in which the SVMM engine 22 is used. Digital input signals can include sensor input data, mathematical image parameters representing physical phenomena, artificial intelligence input data, training input data, still photographs, frames of video images, intervals of speech and any other input signal for the purposes of vector-matrix multiplication.

One or more DACs 40 can be used to convert the digital input signals to analog voltages that can be sourced on the electrodes of the grid 28. One or more ADCs 42 can convert the analog output currents to digital signals, which can be outputted in the output register 34 and transmitted off-chip for further processing or other tasks.

The SVMM engine 22 can be configured such that each electrode of the grid 28 can be an input or an output node, as opposed to devices where only the edge nodes can be input or output nodes. For efficiency purposes, multiple electrodes of the grid 28 can be set in parallel as input electrodes and the remaining electrodes can be read as output electrodes. The circuit layer 26 can be designed with switches 44, which can connect an electrode of the grid 28 to a DAC 40 making that electrode available to receive an input signal. The switch 44 can be toggled to connect an electrode of the grid 28 to an ADC 42, making the electrode available as an output electrode. For efficiency purposes multiple electrodes of the grid 28 (e.g., one or more columns of them) can be used as input electrodes (by for example, appropriately positioning the switches 44 to DACs 40 or via other techniques known to persons of ordinary skill in the art). The remaining electrodes of the grid 28 can be used as output electrodes (e.g., the remaining columns). In some embodiments, the size of input and output electrode sets can be permanent (e.g., by permanent connections in lieu of the switches 44) or be flexible (e.g., by an input/output selector signal controlling the switches 44 individually or in batches) or a combination of permanent and flexible.

For illustrations purposes and as an example, the circuit layer 26 is configured with the columns A and B used for input signals and columns C and D used for reading output signals. Each electrode of the grid 28 is connected to an amplifier 46 in the circuit layer 26. The amplifier 46 can be configured as a buffer or sample-and-hold (SAH) amplifier if its corresponding electrode is to be an input node. The amplifier 46 can also be configured as a transimpedance amplifier to sense a current output if its corresponding electrode is to be an output node.

In one embodiment, a controller 48 can configure the amplifiers 46 as input or output amplifiers, individually or in batches. Controller 48 can also coordinate other functions of the circuits in the circuit layer 26, such as controlling the switches 44 via input/output selector signal, configuring the amplifiers 46, and various functionality related to column and row drivers 36 and 38 as described above. The controller 48 can also manage the timing of various operations and components of the SVMM engine 22, such as the timing of feeding input vectors from input register 32 into the input electrodes of the grid 28, the timing of reading output currents from the output electrodes of the grid 28 and the timing of other functions and components. The controller 48 can include circuitry such as short-term and/or long-term memory, storage, one or more processors, clock signal and other components to perform its function.

Modes of Operations on the Electrodes

Various operations may be performed on the electrodes of the grid 28 depending on the operation mode. In one mode, one or more electrodes can be in training mode, where the resistance at the electrode-mesh interface is to be adjusted. The term "training" is used because in some applications, such as neural network training, the interface resistances can be adjusted based on training algorithms in neural networks (e.g., gradient descent) to construct an effective matrix of conductances. During such operations, the individual resistances at electrode-mesh interfaces may not be known, nonetheless using training algorithms and observing input/output pairs, the resistances can be adjusted up and down until an effective matrix of conductances is formed by the resistances of the collection of electrode-mesh interfaces.

In another mode, one or more electrodes can be in WRITE mode, where an appropriate amount of voltage bias is applied from the column and/or row drivers 36 and 38, and an input voltage value is sourced at the one or more electrodes via one or more corresponding DACs 40.

In another mode, one or more electrodes can be in READ mode, where an appropriate amount of voltage bias is applied from the column and/or row drivers 36 and 38, and an output current is read from the one or more electrodes via one or more corresponding ADCs 42.

Example Operation of SVMM Engine 22

An example and configuration of the SVMM engine 22 is now described in relation to FIG. 4. Columns A and B are assigned as input electrodes and columns C and D are assigned as output electrodes. The amplifiers 46 in columns A and B are configured as SAH amplifiers and the amplifiers 46 in columns C and D are configured as transimpedance amplifiers capable of sensing current. Switches 44 in columns A and B connect amplifiers 46 in Columns A and B to DACs 40. The Switches 44 in columns C and D connect the amplifiers 46 in columns C and D to the ADCs 42 of columns C and D. Column and row drivers 36 and 38 provide appropriate biasing voltages to the electrodes to enable the electrodes in columns A and B for WRITE mode and enable electrodes in columns C and D for READ mode.

One or more DACs 40 convert a first vector of digital input signals received in input register 32 to analog signals and place them on the amplifiers 46 in column A. The amplifiers 46 in column A, configured as SAH amplifiers, hold the input voltages on the electrodes in column A. Next, one or more DACs 40 convert a second vector of digital input signals received in input register 32 to analog signals and place them on the amplifiers 46 in column B. The amplifiers 46 in column B, configured as SAH amplifiers, hold the input voltages on the electrodes in column B. The process can continue if additional columns are used for input and until input columns are fed.

When input voltages are written into the electrodes in columns A and B, the controller 48 can begin scanning and reading output currents at the ADCs 42 in columns C and D and outputting the result into output register 34.

The process above can be repeated with the addition of the step of column and row drivers 36 and 38 placing one or more electrodes in training mode and applying Vdd or ground voltages to them to adjust the resistances at the electrode-mesh interfaces. In this implementation, Vdd is above the SET-voltage and ground voltage is below the RESET-voltage.

The SVMM engine 22 and its circuit layer 26 can be configured where individual electrodes can be used as input/output nodes. As an example, half of the electrodes in the grid 28 can be used as input electrodes and half of the electrodes in the grid 28 can be used as output electrodes. Other divisions of electrodes as inputs or outputs are also possible depending on the application. A DAC 40 writes an input voltage (V1) on an input electrode, through amplifier 46, configured as a buffer or SAH amplifier, so V1 is held on the electrode. Then, the DAC 40 writes the next input voltage (V2) at the next input electrode via the amplifier 46 of the next input electrode. The process continues until the last input electrode receives an input voltage (Vm), where m=half the electrodes in the grid 28. By now, the multiplication has already taken place. The voltages have been multiplied by the electrode-mesh interface resistances to yield the output currents at the output electrodes via Ohm's law.

When writing voltages on the input electrodes are concluded, the controller 48 can scan through the output nodes and read the first output current (I1) via an amplifier 46 configured as a current-sensing amplifier and use an ADC 42 to convert the output current I1 to a digital output and update the output register 34. Then the next output current I2 is read from the second output electrode via the amplifier 46 of the second output electrode, configured as a current-sensing amplifier. The process continues until the output current of the last output electrode is read and the output register 34 is updated. The nodes (or neurons if the SVMM engine 22 is used in neural networks) are traversed once.

Applications of SVMM and Analysis of Performance

The SVMM engine 22 can be effectively used in many applications, where the matrix of conductances of the SVMM engine 22 can be adjusted in various directions in a manner that optimizes a desirable function, for example, an activation function in a neural network and in other contexts. Other computational tasks can also utilize the SVMM engine 22. Examples include, various image processing tasks, where images are matrix data representing physical phenomena, such as speech, weather, temperature, or other data structures as may exist in financial data, radar data, sensor data, still photographs, video image frames and other applications.

The SVMM engine 22, utilizing a sparse network of conductances, offers a substantial performance advantage compared to devices using dense network of conductances. Sparse networks are similar to the way human brain functions. In sparse networks, not every information node is connected to all other information nodes. Only some information nodes are connected. The sparsity is believed to enable superior computational ability with economical use of area and resources compared to the more expensive networks, such as dense networks, where all information nodes are connected. Additionally, dot-product engines utilizing dense networks have proven expensive and complicated to design and operate due to the need to precisely control the resistances of the conductance matrix and difficulties in electrical or mechanical control of nanoscale material.

Additionally, the sparse matrix of conductances of SVMM engine 22 offers a higher performance to area ratio compared to devices utilizing dense networks for matrix multiplication. In the sparse network of the SVMM engine 22 input and output nodes (or neurons in the context of neural networks) can exist over the area of the conductance matrix of the engine. By contrast, input and output nodes (or neurons) in dense networks exist only in lateral edges of the network. This allows the SVMM engine 22 a quadratic scaling advantage compared to devices using dense networks. As one increases the number of neurons, the SVMM engine 22 can maintain the same density of neurons, while devices using dense networks start to lose density.

In terms of hardware, the SVMM engine 22 can be implemented as part of a computer system, a graphics processing unit (GPU), a hardware accelerator or as part of an artificial intelligence processor, a machine learning processor, a memory interconnect or other devices where matrix operations are used.

Figure 5:
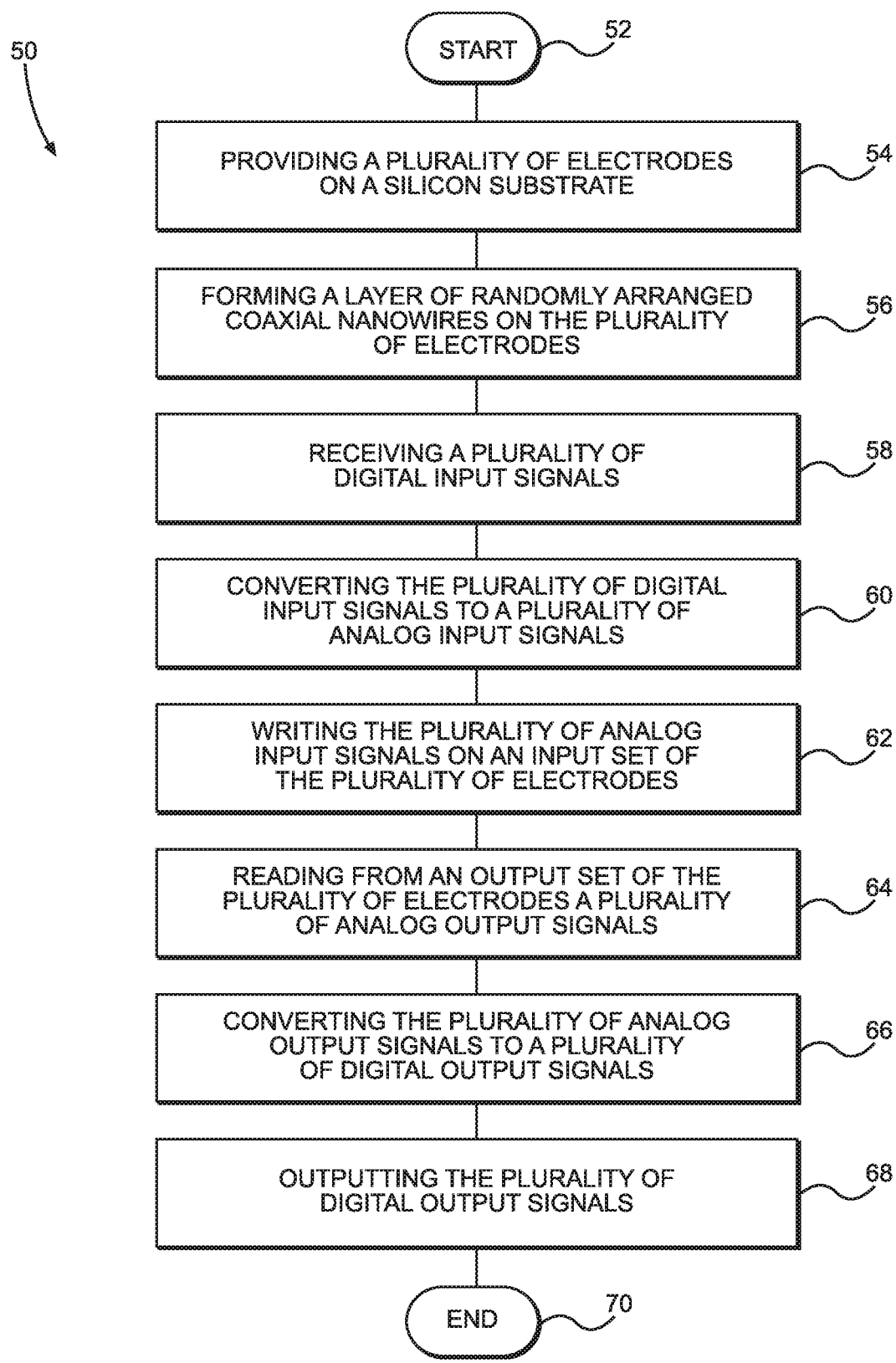
FIG. 5 illustrates a flow chart of a method of sparse vector-matrix multiplication according to an embodiment.

FIG. 5 illustrates a flow chart of a method 50 of sparse vector-matrix multiplication according to an embodiment. The method can be implemented in hardware using embodiments of FIGS. 3 and 4. The method 50 starts at the step 52. The method continues to the step 54 by providing a plurality of electrodes on a silicon substrate. The method then moves to the step 56 by forming a layer of randomly arranged coaxial nanowires on the plurality of electrodes. The method then moves to the step 58 by receiving a plurality of digital input signals. The method moves to the step 60 by converting the plurality of digital input signals to a plurality of analog input signals. The method then moves to the step 62 by writing the plurality of analog input signals on an input set of the plurality of electrodes. The method then moves to the step 64 by reading from an output set of the plurality of electrodes a plurality of analog output signals. The method then moves to the step 66 by converting the plurality of analog output signals to a plurality of digital output signals. The method then moves to the step 68 by outputting the plurality of digital output signals. The method ends at the step 70.

Persons of ordinary skill in the art can appreciate that electrical properties can be defined in terms of a multitude of electrical parameters. For example, while the systems and methods described above may have been illustrated and explained in terms of conductances, voltages and currents, these parameters are related, and a person of ordinary skill in the art can readily explain or design the same described systems or perform the same methods in terms of resistances instead of conductances, currents instead of voltages, and voltages instead of currents. For example, because current and voltage are related with Ohm's law, currents instead of voltages can be used to write into an electrode and voltages read at the output.

What is claimed is:

1. A system of sparse vector-matrix multiplication comprising:
   a circuit layer;
   a plurality of electrodes on the circuit layer; and
   a mesh on and sparsely coupled to the plurality of electrodes, the mesh comprising a plurality of nanowires forming an irregular network, wherein the circuit layer is configured to:
   receive a first plurality of input signals;
   write a second plurality of input signals on an input set of the plurality of electrodes;
   read from an output set of the plurality of electrodes a first plurality of output signals; and
   output a second plurality of output signals.

2. The system of claim 1, wherein the plurality of nanowires comprises of coaxial nanowires having a conductive core wrapped in two-terminal non-volatile memory (NVM) material.

3. The system of claim 2, wherein the non-volatile memory material comprises a voltage-controlled resistance material.

4. The system of claim 1, wherein the first plurality of input signals is the second plurality of input signals.

5. The system of claim 1, wherein the circuit layer converts the first plurality of input signals to the second plurality of input signals.

6. The system of claim 1, wherein the first plurality of output signals is the second plurality of output signals.

7. The system of claim 1, wherein the circuit layer converts the first plurality of output signals to the second plurality of output signals.

8. The system of claim 1, wherein the circuit layer further comprises a column driver and a row driver configured to selectively provide at least one of biasing voltages and training voltages to at least a portion of the plurality of the electrodes.

9. The system of claim 1, wherein the plurality of electrodes and the mesh comprise a sparsely coupled matrix of conductances.

10. The system of claim 9, wherein the matrix of conductances is tunable using one or more of temperature-driven phase-change memory mechanisms, unipolar resistive switching, and bipolar memristive mechanisms.

11. A method of providing a sparse vector-matrix multiplication system, comprising:
providing a circuit layer;
providing a plurality of electrodes on the circuit layer;
providing a plurality of coaxial nanowires forming an irregular network on the plurality of electrodes, the plurality of coaxial nanowires being arranged in a mesh; and
sparsely coupling the plurality of coaxial nanowires to the plurality of electrodes.

12. A method of performing a sparse vector-matrix multiplication, comprising:
receiving at an input set of a plurality of electrodes a plurality of input signals from a circuit layer, the plurality of electrodes being sparsely connected to a plurality of coaxial nanowires on the plurality of electrodes, the plurality of coaxial nanowires forming an irregular network and being arranged in a mesh; and
reading from an output set of the plurality of electrodes a plurality of output signals.

13. The method of claim 12, wherein the coaxial nanowires comprise a metal core wrapped in two-terminal non-volatile memory (NVM) material.

14. The method of claim 13, wherein the NVM material comprises one or more of a voltage-controlled resistance, memristor, phase-change material (PCM), and resistive random-access-memory (ReRAM) material.

15. The method of claim 14 further comprising:
selectively providing biasing voltages to at least a portion of the plurality of the plurality of electrodes to enable writing voltages into or reading currents from the plurality of the electrodes.

16. The method of claim 14, wherein voltage-controlled resistances are at intersections of the plurality of the electrodes and the plurality of coaxial nanowires and the method further comprises selectively providing training voltages to at least a portion of the plurality of the electrodes.

17. The method of claim 12, wherein the plurality of input signals comprise voltages and the plurality of output signals comprise currents.

18. The method of claim 12, wherein the input and output sets each comprise half of the electrodes of the plurality of electrodes.

19. A method of performing vector-matrix multiplication, comprising:
receiving at an input set of a plurality of electrodes a plurality of input signals from a circuit layer, the plurality of electrodes being sparsely connected to a plurality of coaxial nanowires on the plurality of electrodes, wherein the coaxial nanowires comprise a metal core wrapped in two-terminal non-volatile memory (NVM) material, wherein the NVM material comprises one or more of a voltage-controlled resistance, memristor, phase-change material (PCM), and resistive random-access-memory (ReRAM) material, wherein voltage-controlled resistances are at intersections of the plurality of the electrodes and the plurality of coaxial nanowires;
selectively providing training voltages to at least a portion of the plurality of the electrodes;
reading from an output set of the plurality of electrodes a plurality of output signals; and
receiving a training signal indicating which electrodes in the plurality of the electrodes are to be applied the training voltages.

* * * * *

UNITED STATES PATENT AND TRADEMARK OFFICE
CERTIFICATE OF CORRECTION

PATENT NO. : 10,990,651 B2
APPLICATION NO. : 16/543426
DATED : April 27, 2021
INVENTOR(S) : Jack David Kendall Page 1 of 1

It is certified that error appears in the above-identified patent and that said Letters Patent is hereby corrected as shown below:

In the Claims

In Column 13, Line(s) 30, Claim 15, after "claim 14", insert --,--.

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*